(12) United States Patent
Ofek

(10) Patent No.: US 7,351,997 B2
(45) Date of Patent: Apr. 1, 2008

(54) SINGLE PHOTON RECEPTOR

(75) Inventor: Eran Ofek, Modi'in (IL)

(73) Assignee: Physical Logic AG, Zug (CH)

(*) Notice: Subject to any disclaimer, the term of this patent is extended or adjusted under 35 U.S.C. 154(b) by 0 days.

(21) Appl. No.: 11/549,848

(22) Filed: Oct. 16, 2006

(65) Prior Publication Data

US 2007/0228358 A1    Oct. 4, 2007

Related U.S. Application Data

(60) Provisional application No. 60/729,147, filed on Oct. 20, 2005.

(51) Int. Cl.
    *H01L 29/08* (2006.01)
(52) U.S. Cl. .................. 257/39; 257/E39.013; 257/30; 257/E31.051; 257/431; 257/462; 977/954
(58) Field of Classification Search ............ 257/21, 257/30, 39, E39.013, 431, 462, E31.051; 977/937, 954
    See application file for complete search history.

(56) References Cited

U.S. PATENT DOCUMENTS

| 6,720,589 | B1* | 4/2004 | Shields ............ 257/194 |
| 2003/0230629 | A1* | 12/2003 | Bourianoff et al. ..... 235/454 |
| 2005/0247924 | A1* | 11/2005 | Atwater et al. ........ 257/13 |

* cited by examiner

*Primary Examiner*—Matthew C. Landau
*Assistant Examiner*—Minchul Yang
(74) *Attorney, Agent, or Firm*—Edward S. Sherman

(57) ABSTRACT

A photon receptor having a sensitivity threshold of a single photon is readily fabricated on a nanometric scale for compact and/or large-scale array devices. The fundamental receptor element is a quantum dot of a direct semiconductor, as for example in a semiconductor (such as GaAs) isolated from a parallel or adjacent gate electrodes by Nano-scale gap(s). Source and drain electrodes are separated from the photoelectric material by a smaller gap such that photoelectrons created when a photon impinges on the photoelectric material it will release a single electron under a bias (applied between the source and drain to the drain) to the drain electrode, rather than directly to the gate electrode. The drain electrode is connected to the gate electrode by a detection circuit configured to count each photoelectron that flows to the gate electrode.

23 Claims, 4 Drawing Sheets

SINGLE PHOTON RECEPTOR

CROSS REFERENCE TO RELATED APPLICATIONS

The present application claims priority to the U.S. provisional application having Ser. No. 60/729,147 and entitled "Single Photon Receptor", filed on Oct. 20, 2005, which is incorporated herein by reference.

BACKGROUND OF INVENTION

The present invention relates to a photon receptor, which may be configured to detect a single photon.

There is a need for a photon receptor that is capable of detecting a single photon. Single photon detection is also useful as a low level light detection means for spectroscopy, medical imaging, military applications or astronomy. An optimum signal to noise ratio is achieved when a photon wave is detected by an array of photon receptors, as the noise is then limited by the shot noise and is independent of noise.

Single photon receptors are available in the form of photo multiplier tubes (PMT) and single photon avalanche photo diodes (SPAD). PMTs have the disadvantage of having low quantum efficiency, being expensive, bulky, mechanically fragile, and requiring high biasing voltages and cooling. They can also be damaged and can require a long settling time after exposure to high light levels or stray magnetic fields. On the other hand, SPADs have the disadvantage of having a relatively low gain and high dark count rates, especially when operated at higher repetition rates. They are also expensive and require high bias voltages and external cooling.

Prior methods of providing a single photon detection threshold photodetector are described in U.S. Pat. Nos. 6,720,589 and 6,885,023, which are incorporated herein by reference. U.S. Pat. No. 6,885,023 (to Shields, et al., issued Apr. 26, 2005) discloses an optical device and a method of making an optical device, such as a radiation detector or an optically activated memory, that includes a barrier region located between two active regions. One or more quantum dots are provided such that a change in the charging state of the quantum dot or dots affects the flow of current through the barrier region. The charging states of the quantum dots are changed by an optical device.

U.S. Pat. No. 6,720,589 (also to Shields, issued Apr. 13, 2004) discloses a semiconductor device, which can be configured as optically activated memories or single photon detectors. The devices comprise an active layer with a plurality of quantum dots and an active layer. The devices are configured so that charge stored in the quantum dots affects the transport and/or optical characteristics etc of the active layer. Hence, measuring such a characteristic of the active layer allows variations in the carrier occupancy of the quantum dots to be determined The devices of the '023 and '589 patents generally require fabricating devices having one or more sheets of semiconductor quantum dots buried within another thin film layer, and generally comprising 4 to 8 total layers to form an active device. As the fabrication of multiple thin films and active semiconductor layers in the structure suggested in the above patents poses technical challenges that generally decrease yield and increase manufacturing cost.

SUMMARY OF INVENTION

In the present invention, a single photon receptor comprises a direct semiconductor quantum dot a drain electrode disposed adjacent to the first side of the quantum dot being there from separated by a first gap, a source electrode disposed adjacent and opposite the first side of the quantum dot being separated there from by a second gap, a collector region disposed opposite the quantum dot being separated there from by a third gap, the third gap being greater than the first and second gap. A detection unit having electron counting means is disposed between the collector region and the drain electrode, wherein applying a bias between drain and source electrodes causes photoelectrons generated when light impinges on the quantum dot to flow from the quantum dot to the drain electrode, and from the drain electrode to the collector through the detection unit. The unit comprises a switch that opens or closes in response to each electron flowing through it permitting the counting of photons received by the quantum dot.

A second aspect of the invention is characterized in that the single photon receptor is fabricated from a planar substrate that has been coated with planar layers of a direct semiconductor, such as Gallium Arsenide and alloys thereof, (GaAs) separated by an insulator such as silicon dioxide (SiO2). Such a substrate would have a layer structure sequences of such as of: GaAs/SiO2/GaAs/bulk substrate of undoped silicon, and may include additional layers of isolated semiconductors, such as N or P doped silicon for forming solid state detection circuitry.

The above and other objects, effects, features, and advantages of the present invention will become more apparent from the following description of the embodiments thereof taken in conjunction with the accompanying drawings.

DETAILED DESCRIPTION

Figure 1:
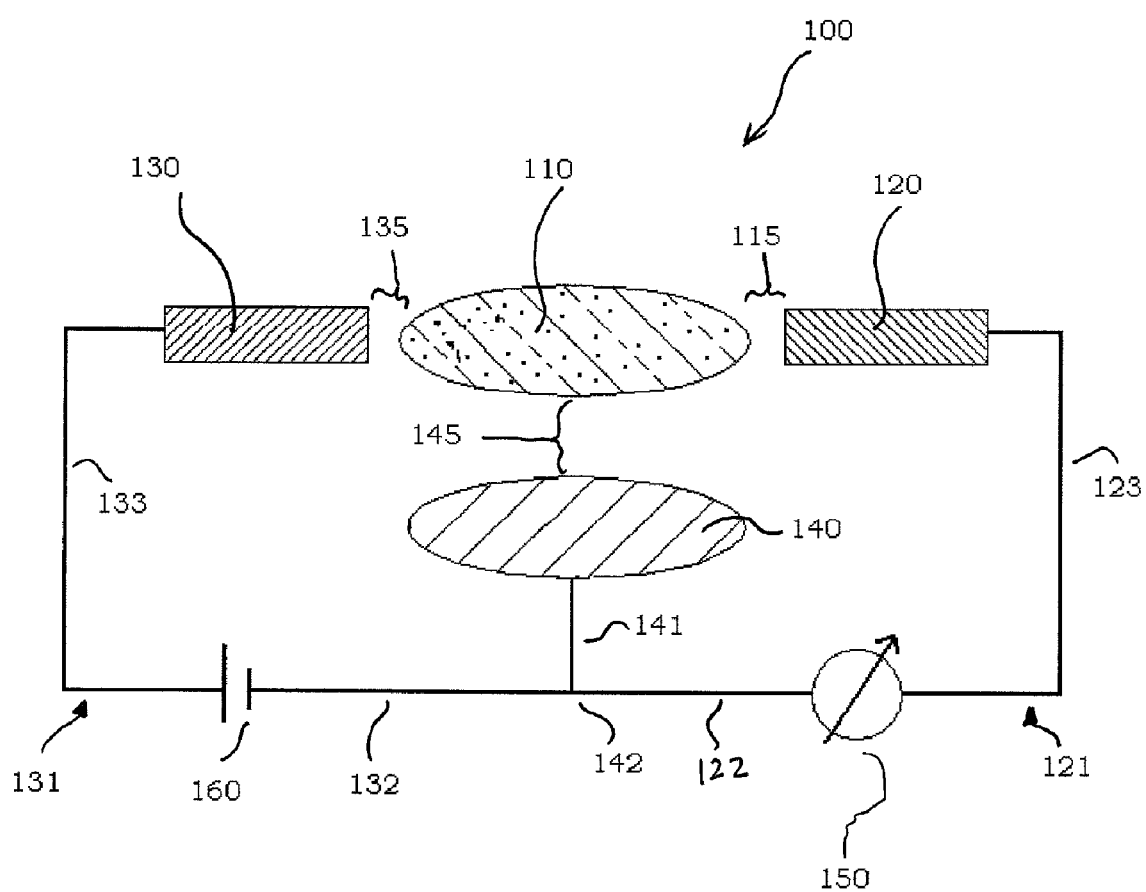
FIG. 1 is a schematic illustration showing a first embodiment of the invention
Figure 2:
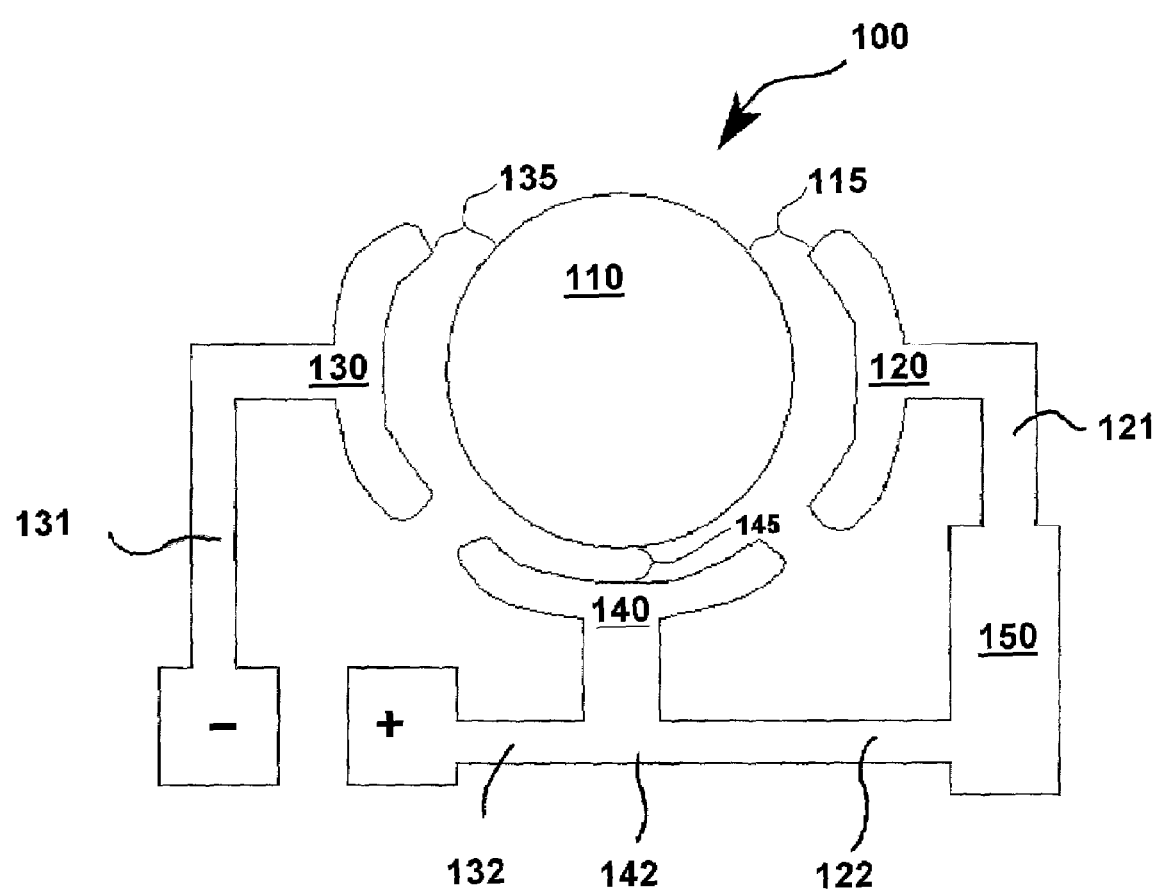
FIG. 2 is a plan view of a second embodiment of the invention.

Referring to FIGS. 1 through 4, wherein like reference numerals refer to like components in the various views, there is illustrated therein a new and improved photodetector, generally denominated 100 herein.

In accordance with the present invention, FIG. 1, the photodetector 100 comprises a direct semiconductor quantum dot 110, a positive or drain electrode 120 separated from the semiconductor quantum dot 110 by a first gap 115, a negative or source electrode 130 separated from the semiconductor quantum dot 110 by a second gap 135 and a gate electrode 140 separated from the direct semiconductor quantum dot 110 by a third gap 145. Circuit trace 121 connects the positive or drain electrode 120 to the gate electrode 140. Circuit trace 131 connects the negative or source electrode 130 to the gate electrode 140.

Generally, the gate electrode 140 is the same order of size as the direct semiconductor quantum dot 110. However, the positive or drain electrode 120 is connected to the gate electrode 140 via a detection unit 150 disposed between portion 123 and 122 of circuit trace 121. The detection unit 150 generally comprises one or more photodiodes (n-p-n type). It will be recognized by those of ordinary skill in the art that Single Electron Transistors (SET) technologies can be deployed to intercept generated electron (from absorption of Photon in GaAs and some other materials) and then count them with a digital signal processor and like components.

The device is powered by a bias means interposed to bisect circuit trace 131 into a first segment 133 connecting negative or source electrode 130 to the negative pole of bias means 160 and a second segment 132 connecting the positive pole of bias means 160 to gate electrode 140 via a second segment 132. It should be appreciated that circuit segments 132 and 122 may both connect directly to gate electrode 140,or as shown in FIG. 1 joint at junction 142, which then connects to gate electrode 140 via circuit segment 141.

The first 115 and second 135 gaps are generally both smaller than the third gap 145 so that when a photon is absorbed by the direct semiconductor quantum dot 110, creating an electron-hole pair; the bias promotes tunneling of the electron to the drain electrode 120. This results in the hole remaining in the quantum dot 110. As the gate electrode 140 is in close proximity to the direct semiconductor 110, the electron, being negatively charged flows to the gate electrode to balance the charge on the quantum dot 110. The detection circuit measures this change in current to count each photon incident on quantum dot 110.

Preferably, the bias is about 1 electron volt, or possibly lower to cause the free photoelectron to tunnel through gap 115. The optimum bias will depend on the shape and effective area of the source and drain electrodes with respect to the quantum dot. In practice, the optimum maximum bias voltage can be readily adjusted when the device is not exposed to any photonic radiation (i.e. a dark state) by reducing the bias until no current flows through the device. Thus, when the device is illuminated, any current generated is due to photoelectrons flowing to the gate electrode 140 to balance the positive charge on the quantum dot 110.

Figure 3:
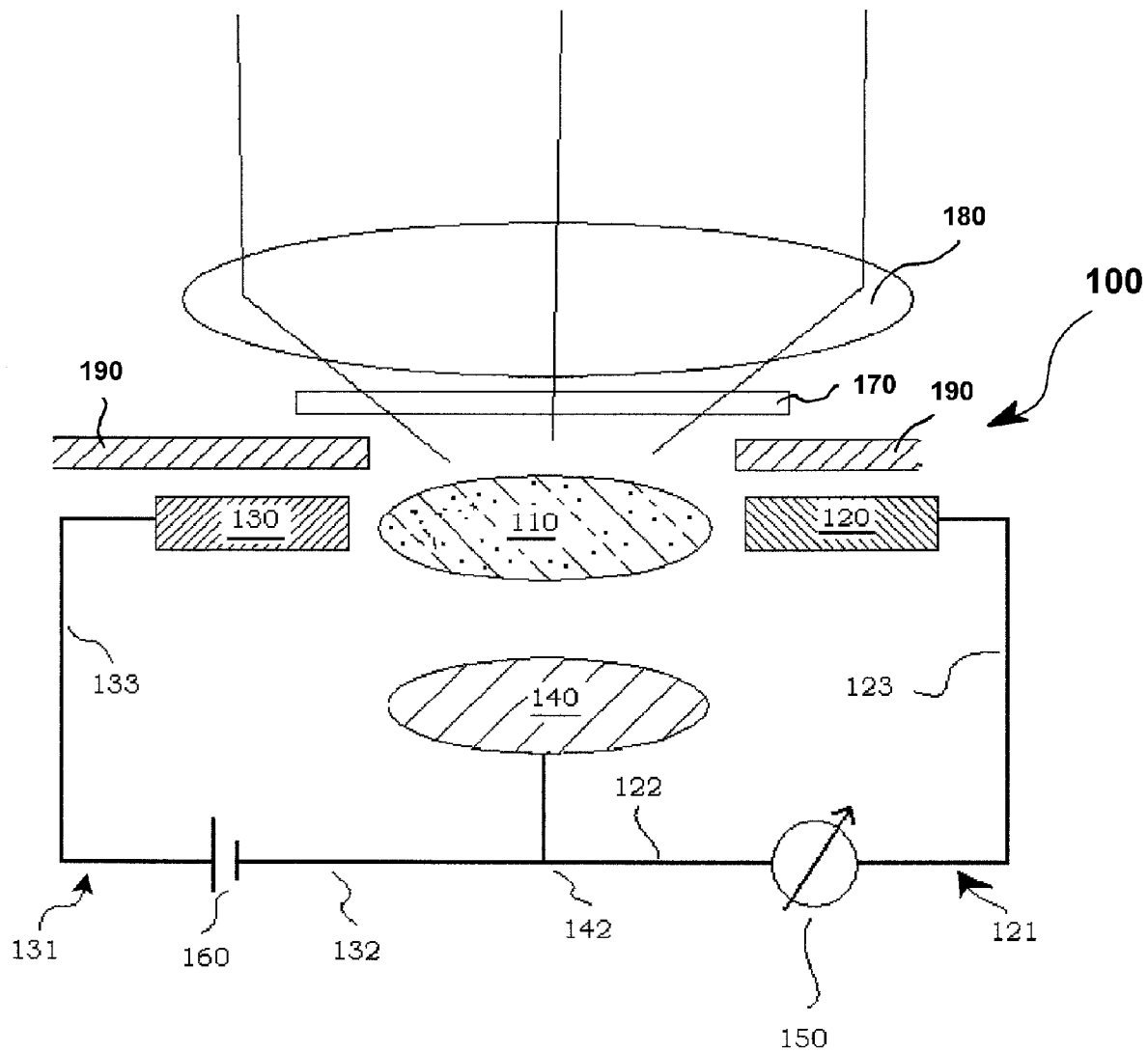
FIG. 3 is a schematic illustration showing another embodiment of the invention that includes filters and/or collection optics.

In additional embodiments of the invention, shown schematically in FIG. 3, an optical filter 170 is deployed to block, reject or reflect light of wavelengths not of interest that would merely add background noise to the signal, i.e. photons of interest.

In an alternative embodiment, shown schematically in FIG. 3, collection optics 180 are deployed above the photodetector 100 to focus photons on the smallest possible quantum dot so as to increase the absolute area sensitivity of the device. Although the collection optical element 180 is illustrated as a refractive optical lens, it will be appreciated by one of ordinary skill in the art that any device that acts as an electromagnetic field director, such as without limitation reflective optics, including fresnel optics, as well as hybrid and diffractive optical elements are equally applicable to improve the area sensitivity of the device by collecting and focusing photons from an area much larger than the device itself.

FIG. 3 also illustrates an optical mask 190 that blocks, absorbs or reflects all radiation that might be incident on portions of the device other than quantum dot 110. This is important in embodiments wherein the source, drain and gate electrodes are fabricated from direct semiconductor materials to limit the production of electron-hole pairs to the quantum dot portion 110 of device 100.

Examples of potentially suitable materials for such quantum dots are GaAs, InP, $Al_xGa_{(1-x)}As$, $GaxIn_{(1-x)}AsyP_{(1-y)}$, GaInNAs and GaInNAsSb. GaAs, or gallium arsenide is particularly preferred as a direct semiconductor. When the direct semiconductor that forms the quantum dot is GaAs, the quantum dot diameter may be as small as about 1 to 5 nm with a thickness as small as about 2 lattice layers. It should be appreciated that the important distinction on the size of the semiconductor is that it has dimensions that cause it to act as a quantum dot. Thus, to the extent that it may be possible to form quantum dots with much larger molecules, for example considering the possibility of organic direct semiconductor molecules, the physical size of a quantum dot can be significantly larger than 5 nm, and conceivably as larger as several microns.

However, in the preferred embodiments utilizing GaAs as the direct semiconductor when the physical gap between each electrode and GaAs photoelectric material is about 1 to 5 nm, then the gap between the GaAs quantum dot and the collector or gate electrode will generally be greater than this first gap, generally by at least about 1 nm. It should also be appreciated that the maximum gap between each of the source and drain electrode with the quantum dot will depend on the bias and electrode shapes, so that the resistance due to the gap will be greater than the thermal energy fluctuation at room temperature.

In some embodiments, the collector 140 is a parallel disk of substantially the same size as the quantum dot. This can be readily accomplished by forming the device of either FIG. 1 or 2 from a multilayer semiconductor substrate. Such a multilayer semiconductor substrate comprises a bulk silicon substrate having thereon a layer of silicon dioxide A layer of doped conductive silicon is disposed on the layer of insulating silicon dioxide. Then another layer of insulating silicon dioxide, or another dielectric material, is disposed on the doped conductive silicon. Finally, a layer of the direct semiconductor that is a photoreceptor, such as gallium arsenide (GaAs), is deposited on the dielectric layer. U.S. Patent Application No. 2004/0232525 (to Ramdani, et al., published Nov. 25, 2004) describes various methods of forming structures comparable to the above wherein a semiconductor structure, from any of the Group 111A and VA elements (III-V semiconductor compounds), mixed III-V compounds, Group II (A or B) and VIA elements (II-VI semiconductor compounds), and mixed II-VI compounds can be formed on doped, i.e. conductive silicon with an intervening layers dielectric or insulating thin film, material, such as silicon dioxide.

A central region of the upper GaAs layer is readily defined by the etching processes to have nanoscale lateral dimensions so as to form a quantum dot. Adjacent layer of GaAs form the source and drain electrodes respectively, with the gap between each of the drain and source electrode being defined by the width of the etched trench that continues down to $SiO_2$ layer. The third gap is defined by the thickness of the $SiO_2$ layer which separates the upper most parallel and planar quantum dots of GaAs from the gate electrode of conductive silicon. It should be appreciated that the conductive traces between adjacent portion of the upper layer of GaAs (the source electrode) and the lower GaAs layer that forms the gate electrode or collector can be formed as vias between through the intervening layers. Likewise, the conductive traces between adjacent layer of GaAs (the drain electrode) and the lower GaAs layer that forms the gate electrode or collector can be formed as vias between through the intervening layers that also connect detector electronics.

Figure 4:
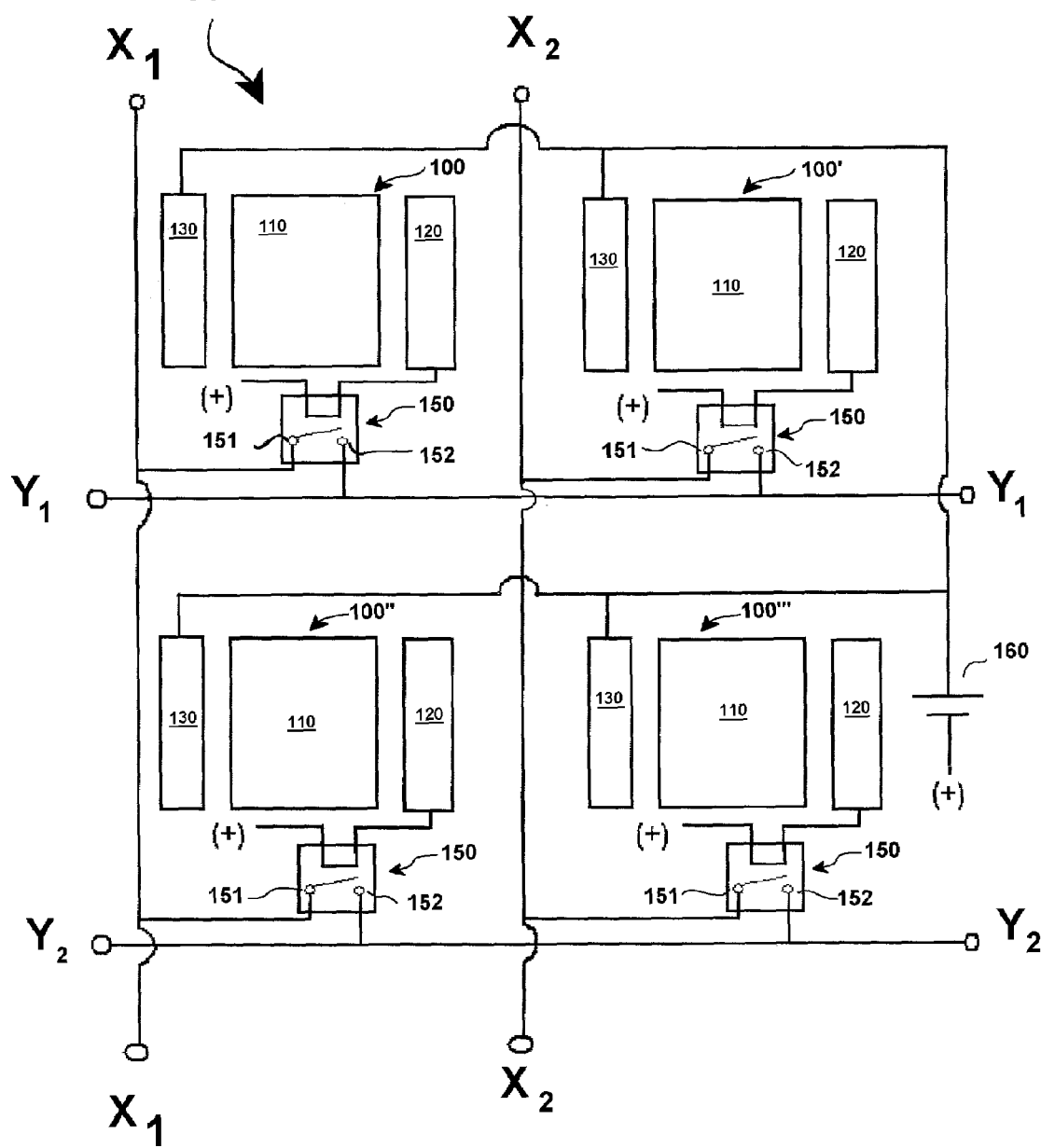
FIG. 4 is a plan view illustrating another embodiment of the invention that includes a plurality of sensors organized as an array.

It should also be appreciated that as the photodetector 100 can be fabricated with nano sized detector elements; other embodiments of the invention include arrays of multiple detectors with adjacent thin film detection circuits. An exemplary portion of such an array 400 is shown in FIG. 4, showing four photodetectors: 100, 100', 100" and 100'''. The electron detection circuitry 150 is preferably formed as integrated circuits on the same substrate as each detector 100. Further, a common bias source 160 may be used to power each of the four detectors 100 in array 400, being connected in parallel to the source electrode 130 adjacent each semiconductor quantum dot 110. However, the drain electrode 120 adjacent each semiconductor quantum dot 110 is connected to a separate electron detector 150. The electron detection circuitry 150 may take the form of any known solid state device that acts as a relay of switch such as transistors and zener diodes. The X and Y traces adjacent each photodetector 100 are connected to the electron detector 150 at switch contacts 151 and 152. Normally the X and Y traces, labeled X1, X2 and Y1 and Y2 are isolated from each other. However, the flow of an electron from drain electrode 120 to electron detector 150 closes the switch shorting poles 151 and 152 between adjacent pair of traces X1 and Y1. Each of the X and Y traces is connected to addressing circuitry to detect such shorts and thus correlate the closing of switch 150 with a specific location on the detector 400 where each photon is received. Such addressing circuitry is well known to one of ordinary skill in the art of photodetector arrays used in imaging devices and the like.

While the invention has been described in connection with a preferred embodiment, it is not intended to limit the scope of the invention to the particular form set forth, but on the contrary, it is intended to cover such alternatives, modifications, and equivalents as may be within the spirit and scope of the invention as defined by the appended claims.

The invention claimed is:

1. A photon receptor device comprising:
 a single quantum dot having a first side and an opposing second side,
 at least one drain electrode disposed adjacent to the first side of said quantum dot being separated therefrom separated by a first gap,
 a source electrode disposed adjacent the second side of said quantum dot being separated therefrom by a second gap,
 a collector region disposed opposite to said quantum dot being separated therefrom by a third gap, the third gap being greater than the first and second gap,
 an electron detection unit disposed between said collector region and said drain electrode,
 wherein applying a bias to said drain and source electrodes causes photoelectrons generated when light impinges on said quantum dot to flow from said quantum dot to said drain electrode, and from said drain electrode to said collector region through said detection unit to discriminate each photoelectron thus received or collected, wherein each of said source and drain electrodes is immediately adjacent to the first and second side of said quantum dot without any intervening quantum dots.

2. A photon receptor device according to claim 1 wherein the quantum dot is a direct semiconductor.

3. A photon receptor device according to claim 2 wherein the semiconductor is gallium arsenide.

4. A photon receptor device according to claim 1 wherein the quantum dot has a diameter of less than about 5 nanometers.

5. A photon receptor device according to claim 1 wherein the first gap is less than about 5 nanometers.

6. A photon receptor device according to claim 1 wherein the detection unit comprises a solid state relay or switch.

7. A photon receptor device according to claim 6 wherein the solid state relay or switch deploys at least one of a transistors and a zener diode.

8. A photon receptor device according to claim 1 and further comprising an optical filter disposed to selectively block photons from impinging on said direct semiconductor quantum dot.

9. A photon receptor device according to claim 1 and further comprising collection optics to concentrate photons to impinge on said quantum dot.

10. A photon receptor device according to claim 1 and further comprising an optical mask to block photons from impinging on portions of the device other than on said quantum dot.

11. A photon receptor device comprising:
 a substrate having at least an insulating upper layer,
 a first conductive layer disposed on the insulating portion of said substrate,
 an insulating dielectric disposed on said first conductive layer,
 a patterned layer of a semiconductor material disposed on said insulating layer that comprises: a quantum dot of the semiconductor material, a drain electrode disposed adjacent to a first side of the quantum dot being separated therefrom separated by a first gap, a source electrode disposed adjacent and opposite the first side of the quantum dot being separated therefrom by a second gap,
 a collector region formed in said first conductive layer disposed opposite the quantum dot being separated therefrom by the insulating dielectric layer, wherein the insulating dielectric layer has a thickness greater than the first and second gaps,
 an electron detection unit disposed between said collector region and said drain electrode,
 wherein applying a bias to said drain and source electrodes causes photoelectrons generated when electromagnetic radiation impinges on the quantum dot to flow from the quantum dot to said drain electrode, and from said drain electrode to said collector region through said detection unit to discriminate each photoelectron thus received or collected.

12. A photon receptor device according to claim 11 wherein the semiconductor material comprises gallium arsenide.

13. A photon receptor device according to claim 11 wherein the insulating dielectric layer is silicon dioxide.

14. A photon receptor device according to claim 11 wherein the collector region is a semiconductor layer.

15. A photon receptor device according to claim 14 wherein the insulating dielectric layer is silicon dioxide.

16. A photon receptor device according to claim 14 wherein the collector region is a layer of conductive doped silicon.

17. A photon receptor device according to claim 11 wherein the quantum dot has a diameter of less than about 5 nanometers.

18. A photon receptor device according to claim 10 wherein the quantum dot is separated from the collector region by an insulating dielectric layer that has a thickness of less than about 5 nanometers.

19. A photon receptor array comprising:
- a plurality of quantum dots organized in a 2-dimensional array on a planar surface, each quantum dot having a first side and an opposing second side,
- a first plurality of parallel conductive lines corresponding to each of the quantum dots in the array,
- a second plurality of conductive lines corresponding to each of the quantum dots in the array, said second plurality being orthogonal with respect to the lines in said first plurality,
- a plurality of drain electrodes corresponding to each of the quantum dots in said array, each drain electrode disposed adjacent to the first side of the corresponding quantum dot and being separated therefrom separated by a first gap,
- a plurality of source electrodes corresponding to each of the quantum dots in said array, each source electrode disposed adjacent to the second side of the corresponding quantum dot and being separated therefrom by a second gap, wherein each of said corresponding source and drain electrodes are immediately adjacent to the first and second sides of the corresponding quantum dot without any intervening quantum dots,
- a plurality of collector regions corresponding to each of the quantum dots in said array, each collector region disposed opposite to the corresponding quantum dot being separated therefrom by a third gap, the third gap being greater than the first and second gap,
- a detection unit corresponding to each quantum dot in the array disposed between each corresponding collector region and each corresponding drain electrode having means to close a switch between each of the orthogonal conductive lines from said first and second plurality that correspond with the quantum dots in response to the flow of an electron from the drain electrode to the collector region,
- whereby applying a bias to each of the drain and source electrodes in said pluralities thereof causes photoelectrons generated when electromagnetic radiation impinges on a quantum dot to flow from the quantum dot to the corresponding drain electrode, and from the drain electrode to the corresponding collector region through the corresponding detection unit to close the switch between the pair of orthogonal conductive lines corresponding to the quantum dot.

20. A photon receptor array according to claim 19 wherein the quantum dots are semiconductors.

21. A photon receptor array according to claim 19 and further comprising an optical filter disposed to selectively block photons from impinging on said quantum dots.

22. A photon receptor array according to claim 19 and further comprising collection optics to concentrate photons to impinge on said quantum dots.

23. A photon receptor array according to claim 19 and further comprising an optical mask to block photons from impinging on portions of the device other than on said quantum dots.

* * * * *